United States Patent
Farooq et al.

(10) Patent No.: US 9,059,175 B2
(45) Date of Patent: Jun. 16, 2015

(54) FORMING BEOL LINE FUSE STRUCTURE

(75) Inventors: Mukta G. Farooq, Hopewell Jct., NY (US); Emily R. Kinser, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 13/297,338

(22) Filed: Nov. 16, 2011

(65) Prior Publication Data

US 2013/0119509 A1    May 16, 2013

(51) Int. Cl.
*H01L 23/62* (2006.01)
*H01L 23/525* (2006.01)
*H01L 27/10* (2006.01)

(52) U.S. Cl.
CPC ........ *H01L 23/5258* (2013.01); *H01L 23/5256* (2013.01); *H01L 27/101* (2013.01)

(58) Field of Classification Search
CPC .... H01L 23/525; H01L 23/5256; H01L 23/62
USPC ....................................................... 257/529
See application file for complete search history.

(56) References Cited

U.S. PATENT DOCUMENTS

| | | | |
|---|---|---|---|
| 6,555,458 B1 | 4/2003 | Yu | |
| 7,579,266 B2 | 8/2009 | Sakoh | |
| 7,732,922 B2 | 6/2010 | Yang et al. | |
| 7,867,832 B2 | 1/2011 | Yang et al. | |
| 7,893,520 B2 | 2/2011 | Yang et al. | |
| 2001/0050386 A1* | 12/2001 | Suzuki et al. | 257/296 |
| 2006/0231921 A1 | 10/2006 | Van Kampen et al. | |
| 2009/0174075 A1* | 7/2009 | Yang et al. | 257/751 |
| 2010/0032797 A1* | 2/2010 | Takewaki | 257/529 |
| 2010/0182041 A1* | 7/2010 | Feng et al. | 326/38 |

OTHER PUBLICATIONS

Hau-Riege et al., "Use of scanned laser annealing to control the bamboo grain length of Cu interconnects", Applied Physics Letters, vol. 77, No. 3, Jul. 17, 2000, pp. 352-354.
Hau-Riege et al., "Electromigration in Cu interconnects with very different grain structures", Applied Physics Letters, vol. 78, No. 22, May 28, 2001, pp. 3451-3453.
Kulkarni et al., "High-Density 3-D Metal-Fuse PROM featuring 1.37μm2 1T1R Bit Cell in 32nm High-k Metal-Gate CMOS Technology", 2009 Symposium on VLSI Circuits Digest of Technical Papers, 2 pages.
Kulkarni et al., "A 4 kb Metal-Fuse OTP-ROM Macro Featuring a 2 V Programmable 1.37 m2 1T1R Bit Cell in 32 nm High-k Metal-Gate CMOS", IEEE Journal of Solid-State Circuits, vol. 45, No. 4, Apr. 2010 pp. 863-868.

* cited by examiner

*Primary Examiner* — Jae Lee
(74) *Attorney, Agent, or Firm* — Yuanmin Cai; Hoffman Warnick LLC

(57) ABSTRACT

In one embodiment, the invention provides a back-end-of-line (BEOL) line fuse structure. The BEOL line fuse structure includes: a line including a plurality of grains of conductive crystalline material; wherein the plurality of grains in a region between the first end and a second end include an average grain size that is smaller than a nominal grain size of the plurality of grains in a remaining portion of the line.

8 Claims, 5 Drawing Sheets

FORMING BEOL LINE FUSE STRUCTURE

BACKGROUND OF THE INVENTION

The subject matter disclosed herein relates generally to semiconductor fabrication, and more particularly, to methods of forming a back end of line (BEOL) programmable eFUSE memory element structure, and a related semiconductor structure.

An eFUSE is a type of one-time programmable memory element incorporated into integrated circuits to enable dynamic programming of the associated circuits, even after the fabrication of the associated semiconductor device is completed. The eFUSE is programmed by blowing the fuse, which changes the state of the corresponding bit from the initial state value of "1" to a value of "0" after the fuse blow. Since an eFUSE is a one-time programmable memory type, meaning once the fuse has been blown, the process in not reversible, once a fuse has been programmed, the associated data are permanently stored.

In semiconductor processing, eFUSE structures may be formed as part of front-end-of-line (FEOL) processing, as part of the device fabrication process, or also as part of back-end-of-line (BEOL) processing where wiring is formed to connect to the semiconductor devices created during FEOL processing. Depending on where in the semiconductor build the eFUSE element is fabricated, different eFUSE designs and materials are required. Traditional FEOL fuses are silicide-based and rely on electromigration of silicide to program the fuse. The introduction of high-k metal gate materials into the FEOL integration in the state of the art advanced semiconductor technologies created challenges with blowing FEOL fuses. This has led to an increased use of BEOL eFUSE elements in advanced technology nodes.

In the BEOL, eFUSE structures may include via fuses or line fuses. Conventionally, via fuses are utilized because higher programming currents (i.e., more energy) are required in order to blow line fuses due to the larger cross-sectional area associated with line fuses.

BRIEF DESCRIPTION OF THE INVENTION

A first aspect of the invention provides a back-end-of-line (BEOL) line fuse structure, comprising: a line including a plurality of grains of conductive crystalline material; wherein the plurality of grains in a region between the first end and a second end include an average grain size that is smaller than a nominal grain size of the plurality of grains in a remaining portion of the line.

A second aspect of the invention provides a method of forming a back-end-of-line (BEOL) line fuse structure, the method comprising: forming a line of conductive crystalline material within a metal level, wherein the conductive crystalline includes a plurality of grains; and annealing the exposed top surface of the conductive crystalline material in the line using a programmable energy source, such that a region between a first end of the line and a second end of the line is not exposed to the anneal

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1A:
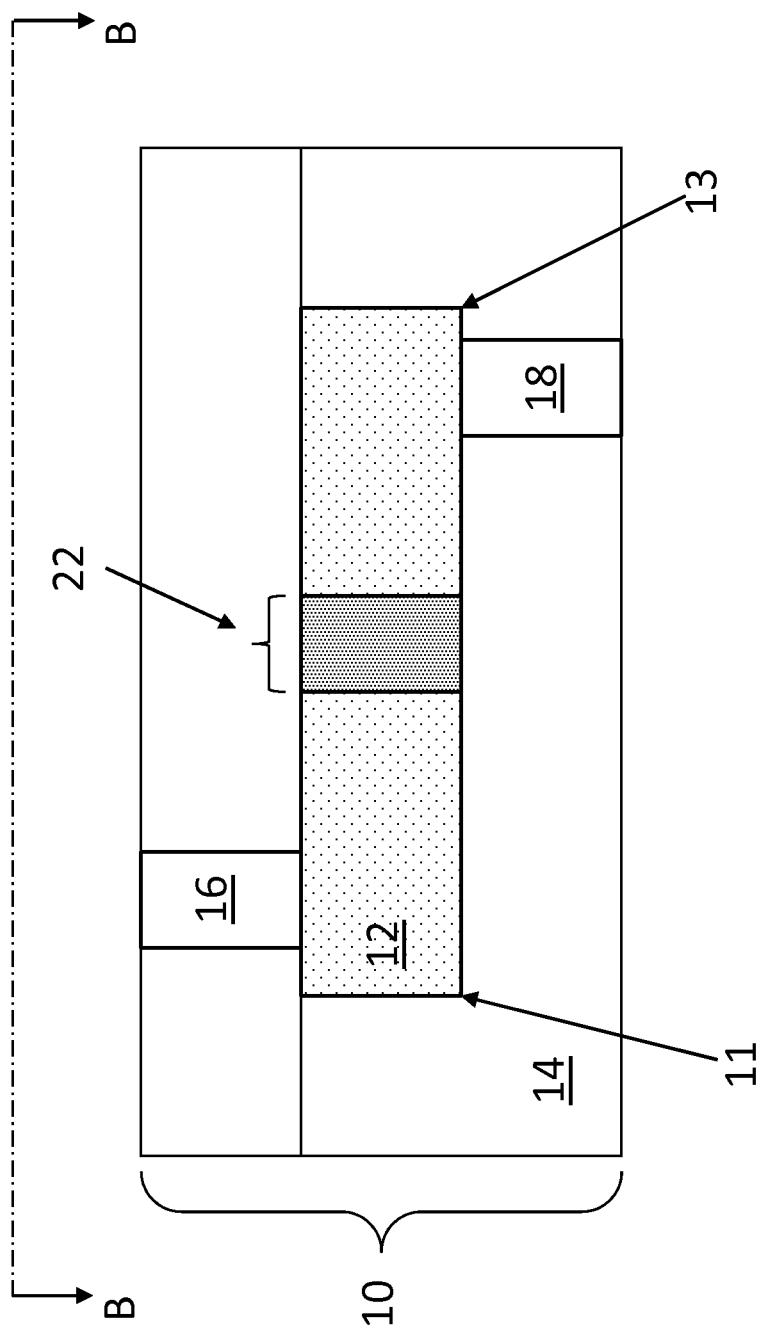
FIGS. 1A and 1B shows a cross-sectional view and a top-down view, respectively, of a BEOL line fuse structure according to an embodiment of the invention.

The subject matter disclosed herein relates generally to semiconductor fabrication, and more particularly, to methods of forming a back end of line (BEOL) programmable eFUSE memory element structure, and a related semiconductor structure.

As noted herein, back-end-of-line (BEOL) processing includes the series of processes in which wiring is formed to connect to the semiconductor devices formed during front-end-of-line (FEOL) processing. BEOL processing generally beings when the first layer of metal wiring is formed on the wafer.

In the BEOL, eFUSE structures may include via fuses or line fuses. Conventionally, via fuses are utilized because higher programming currents (i.e., more energy) are required in order to blow line fuses due to the larger cross-sectional associated with line fuses compared to via fuses. Although via fuses enable lower programming currents, at least two levels of metal wiring are required to connect to the via structure on either end, which makes the via fuse structures typically larger in total area required for wiring than a line fuse. In addition to reducing the amount of wiring required, line fuses enable simpler eFUSE cell design and the opportunity for increased reliability of the eFUSE device.

In one embodiment, a line eFUSE structure is disclosed. The line eFUSE structure includes: a line including a plurality of grains of conductive crystalline material; wherein the plurality of grains in a region between a first end and a second end of the line includes an average grain size that is smaller than a nominal grain size of a remaining portion of the line. The region of the line that includes the smaller grain size (the first grain size) defines the region where electromigration of the line material will preferentially occur.

The line fuse described herein can be programmed, or "blown," at a significantly lower current than conventional line fuses due to the presence of the region in which the average grain size is smaller than the nominal grain size of the remaining portion of the line fuse. This line fuse element can be easily formed using existing semiconductor processes and integrated into standard BEOL processing.

For a given volume, a crystalline material has a structure that includes atoms or molecules organized into a finite quantity of grains. The abutting surfaces of adjacent grains are known as the grain boundaries. Applying energy, such as by an annealing process, to a volume of crystalline material would be expected to cause the grains within such volume to grow (and the number of grains in such volume to decrease). As the grains increase in size and the number of grains therefore decreases, the relative volume fraction of grain boundaries also decreases. Accordingly, the electrical conductivity of the material increases with grain size as resistance due to the presence of grain boundaries decreases. Thus, a large grain size is desired to maximize electrical conductivity in traditional BEOL processing.

In the case of a line fuse with a uniform grain size, the location of electromigration within the fuse element can be controlled only with geometric aspects of the fuse design since the homogeneous material of the fuse will have uniform electrical properties. The homogeneous properties of the fuse element material results in comparably high levels of current required to cause electromigration and thus program the fuse. Since the microstructure is homogeneous, a preferential location for electromigration may not exist within the fuse element, which may lead to variability in the fuse blow location and required programming current. By forming a defined region in the microstructure of the fuse element that has an average grain size that is less than the nominal grain size of the bulk of the fuse material, electromigration will occur preferentially in the defined region with smaller relative grain size at comparably lower programming current levels than in the rest of the bulk material with a relative larger grain size in the fuse element.

Turning to FIG. 1A, a cross-sectional view of a line eFUSE structure 10 according to embodiments of the invention is shown. The line eFUSE structure 10 includes a line 12 that includes a plurality of grains of a conductive crystalline material (not shown). The conductive crystalline material may include any conductive material, such as, but not limited to, copper. The line 12 including the conductive crystalline material may be formed in a dielectric layer 14, using semiconductor fabrication techniques known in the art, such as, but not limited to, dual damascene BEOL processing. Dielectric layer 14 may include a single dielectric layer or several dielectric layers. Additionally, intermittent capping layers (not shown) may be included in or between the portions of dielectric layer 14 as required.

Via 18 connects the line 12 to a FET (not shown) or other semiconductor device formed in prior levels of FEOL processing, referred to as the "blow FET." Via 18 may contact the blow FET directly, or indirectly, through other BEOL wiring levels as required. As shown, a second via 16 may connect the line 12 to a higher wiring level (not shown), which ultimately serves to provide the programming current from an external source (not shown) to program the line eFUSE structure.

The line 12 includes a region 22 at some location within line 12. Region 22 may be between a first end 11 of line 12 and a second end 13 of line 12. Further, region 22 may be within line 12, and between via 16 and via 18. That is, region 22 may be electrically in the path between the programming current source (not shown), by via 16, and the blow FET (not shown), by via 18. Region 22 includes a conductive crystalline material of the same chemical composition as the remaining portions of line 12.

The plurality of grains within the region 22 include an average grain size that is smaller than a nominal grain size of the plurality of grains in the remaining portion of the line 12 (i.e., on either side of the region 22). The average grain size of the plurality of grains in region 22 must be less than the nominal grain size of the plurality of grains in the remaining portion of line 12. Regardless, the average grain size of the plurality of grains in region 22 may depend on the width of line 12. For example, the average grain size of the plurality of grains in region 22 may be approximately greater than or equal to a width of line 12. It is understood that the grain sizes of both region 22 and line 12 are not limited by the scope of this invention. Increasing the difference in grain sizes between region 22 and line 12 will result in a larger gradient. This larger gradient creates a more clearly defined preferential location for electromigration in region 22, and thus, results in a more predictable fuse blow location.

Greater differences between the average grain sizes in region 22 and the nominal grain size in the remaining portion of line 12 will also correspond to lower required programming current values. In one embodiment, the cross-sectional area of region 22 is equal to the cross sectional area of each of the remaining portions of line 12 that are adjacent to region 22 (i.e., on either side of region 22). The dimension of region 22 is not limited by scope of the invention, but it is noted that wider dimensions of region 22 will create a larger area of concentrated high resistance, which results in increased Joule heating. This enables electromigration to occur more rapidly and thus, results in a lower required programming current.

Figure 1B:
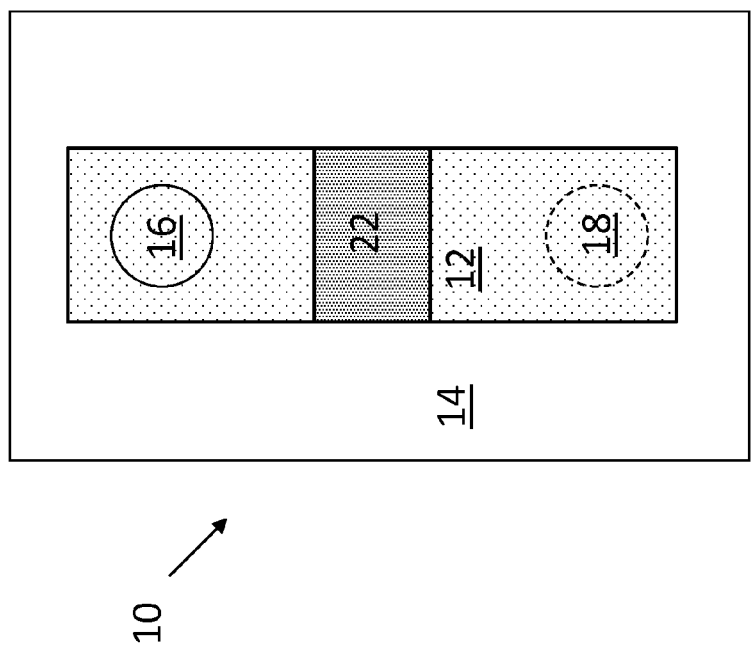

Turning now to FIG. 1B, a top-down perspective view of fuse 10 in FIG. 1A, along plane B-B, is shown. In one embodiment, the region 22 with the average grain size will be continuous across the cross section of line 12. Although line 12 is depicted as having finite starting and ending locations, the incorporation of additional wiring connected to line 12 is not limited by the scope of this invention. Similarly, the locations of vias 16 and 18 are for illustrative purposes only. It is understood that the locations vias 16 and 18 may vary, as long as region 22 is positioned at some location within line 12 between vias 16 and 18.

Achieving a maximum nominal grain size, like the nominal grain size of the plurality of grains of the conductive crystalline material in the remaining portion of the line 12, is desired in order to minimize the electrical resistance within line 12. It would also minimize the electric resistance within any other wiring associated with other semiconductor device structures which are formed simultaneously with line 12 as part of the same level in the semiconductor build and using the same BEOL fabrication processes. Typically, the maximum nominal grain size is achieved by performing an anneal operation after deposition of the conductive crystalline material uniformly across the wiring at a given level within the build. Thus, due to the uniform conductive crystalline material, an applied current is conducted uniformly throughout all of the wiring formed at a given level within the semiconductor build.

By contrast, a smaller average grain size, like the average grain size of the plurality of conductive crystalline material in the region 22 of the line 12, has a higher resistance to the conduction of an applied current due to the higher volume fraction of grain boundaries within a given unit volume, so that when a current is applied localized self-heating develops in region 22 due to the negative temperature coefficient of resistance. As a result of the increase in thermal energy associated with the localized self-heating, the conductive crystalline material will migrate away from the region 22, which is referred to as electromigration. A void will form at the location of initiation of electromigration and interrupt the electrical continuity of the line 12 and "blow," or "program," the fuse structure 10. The relative higher volume fraction of grain boundaries that lead to the increased resistance in region 22 form a preferential location of increased local resistance that will result in an increased rate of localized self-heating in the region 22 compared to the remaining portion of line 12. This line fuse 10 containing region 22 may be blown at a lower programming current than standard line fuses with a homogenous grain size throughout line 12, while still maintaining the desired high electrical conductivity in the majority of the wiring for a giving BEOL level.

Figure 2:
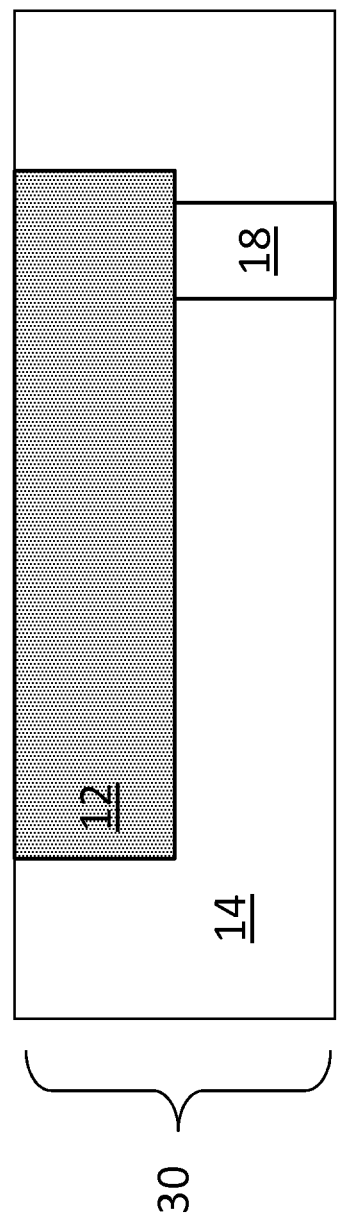
FIGS. 2-4 shows a method of forming a BEOL line fuse structure according to an embodiment of the invention.
Figure 3:
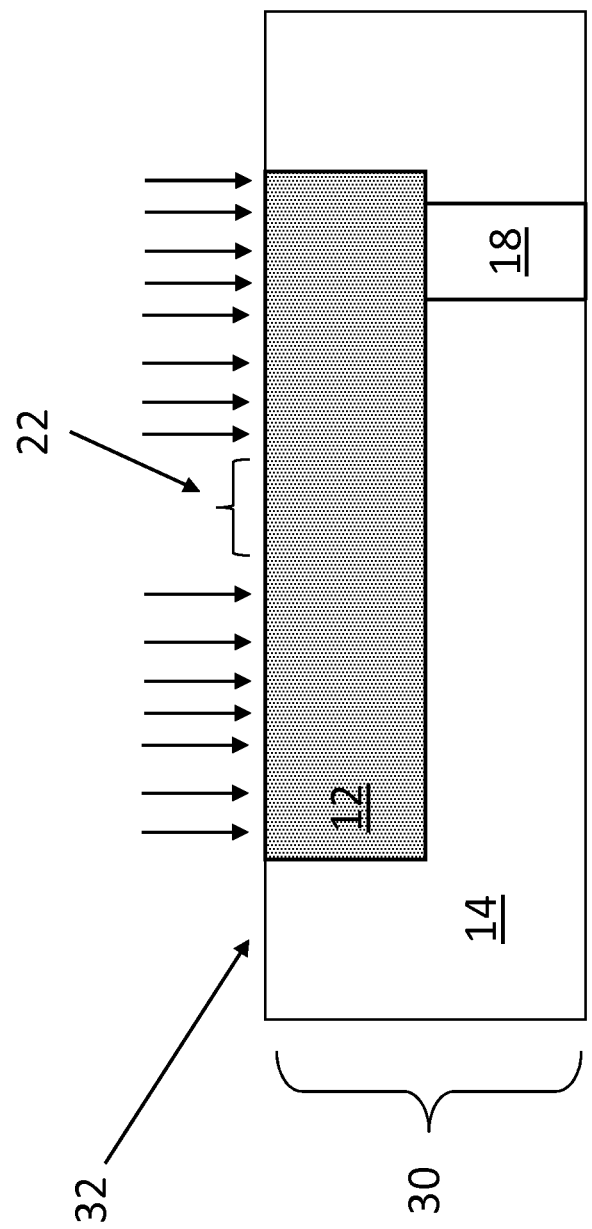
Figure 4:
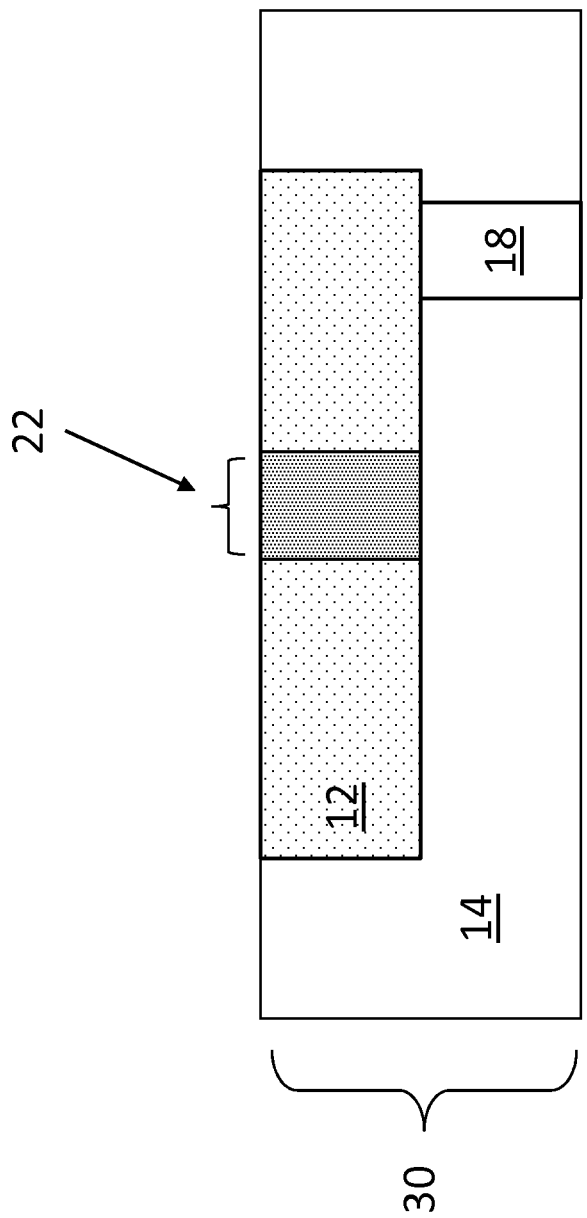

Turning now to FIGS. 2-4, a method of forming the BEOL line fuse structure 10 according to embodiments of the invention is shown.

As seen in FIG. 2, the method of forming the BEOL line fuse structure 10 (FIGS. 1A & B) will be shown herein on a wafer including an existing first metal level structure 30. Existing metal level 30 includes line 12 and via 18 embedded in dielectric layer 14. It is understood that, at this point, standard front-end-of-line (FEOL) and contact processing have been completed, and line 12 is connected to the blow FET formed during FEOL processing (not shown) by via 18 directly. That is, via 18 may be a contact including a different material than line 12, or indirectly through additional BEOL wiring levels (not shown). The formation of metal level 30 may be completed using single damascene or dual damascene BEOL integration, including, but not limited to, the steps of depositing an inter-layer dielectric thin film, such as dielectric layer 14, patterning line 12 using photolithography and reactive ion etch (RIE) to transfer the pattern into the dielectric layer 14, depositing a metallic barrier layer (not shown), filling the etched feature with a conductive crystalline material such as copper, and planarizing using chemical mechanical planarization to result in the structure of metal level 30. Methods for filling the etched feature may include electroplating the conductive crystalline material.

Subsequent to the filling step, line 12 may include a microstructure with a grain size dependent on the properties of the deposition process used to fill line 12. The grain size may or may not be homogenous throughout the cross section of line 12.

Turning now to FIG. 3, the top exposed planar surface 32 of metal level 30 including the conductive crystalline material (i.e., the exposed surface 32 of line 12) is annealed using a programmable energy source 50. The programmable energy source 50 anneals the top exposed surface 32 of line 12, such that a region 22 between a first end of the line 12 and a second end of the line 12 is not exposed to the anneal.

As depicted in FIG. 4, the annealing process causes the grain size of the plurality of grains of the conductive crystalline material to increase in the portions of line 12 exposed to the anneal process. By not being exposed to the programmable energy source during the selective/programmed anneal process, the plurality of grains of conductive crystalline material in region 22 remain the same size (the average grain size) as the initial grain size of line 12 prior to exposure to the anneal operation (i.e., smaller than the nominal grain size of the plurality of grains of conductive crystalline material within the remaining portion of the line 12 which was exposed to the programmable energy source 50.

As an alternative embodiment, chemical mechanical planarization is not required to be completed on the filled structure of metal level 30 prior to proceeding to the programmable anneal exposure step. In such an embodiment, the subsequent anneal step would be completed on any overburden (not shown) of the conductive crystalline material directly connected to line 12 that may exist as a result of the fill process used to form line 12. The areas of the overburden exposed to the anneal step, as well as the base material ultimately remaining in line 12 underneath the selected areas of overburden, would also experience an increase in nominal grain size, while overburden not exposed to the programmable energy source would remain the same grain size that resulted from the fill process used to form the overburden.

The processing of metal level 30 may include the formation of additional capping layers or additional dielectric layers, which are not depicted but known to those skilled in the art. For example, the top exposed planar surface of the conductive crystalline material composing line 12 may be capped with a nitride-based layer, such as silicon-nitride or NBlok®, in order to prevent oxidation or minimize other environmental impacts on the exposed surface of line 12. Other capping layers to promote adhesion or enhance conductivity applied either selectively or as blanket depositions, such as a CoWP cap layer, may also be incorporated into the structure of line fuse 10 as desired or required. If the conductive crystalline material must be capped prior to the annealing process, the programmable energy source 50 must utilize a frequency that is transparent to the applied capping layers.

The programmable energy source 50 may include any presently known or later developed energy source that is able to be programmed in such a way that only targeted areas of the metal level 30 are exposed to the external energy source and thus annealed. For example, the programmable energy source 50 may include a programmable laser source. Alternatively, the programmable energy source 50 may include a programmable e-beam or a programmable ultra-violet heating source.

After the anneal process has been completed on metal level 30, additional metal levels may be formed as required, including the formation of a via 16 (FIG. 1A) contacting line 12 to form an electrical connection between line 12 and an external programming current source (not shown). Any via providing an electrical connection to an external programming source designed to blow the fuse structure in line 12 must contact line 12 so that region 22 lies in an area of line 12 between via 18 and the subsequent via 16 (FIG. 1A), meaning that region 22 is electrically connected serially with via 18 and any via providing an external programming current (not shown).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A back-end-of-line (BEOL) line fuse structure, comprising:
    a single line including a plurality of grains of conductive crystalline material, the single line being the only line; and
    a region of the single line positioned between a first end and a second end of the single line,
    wherein the plurality of grains in the region include an average grain size that is smaller than a nominal grain size of the plurality of grains in a portion of the single line positioned between:
    the region and the first end, and
    the region and the second end.

2. The BEOL line fuse structure of claim 1, wherein the conductive crystalline material is copper.

3. The BEOL line fuse structure of claim 1, wherein the average grain size of the plurality of grains in the region is approximately greater than or equal to a width of the single line.

4. The BEOL line fuse structure of claim 1, wherein a width of the region between the first end and the second end of the single line is approximately greater than or equal to a width of the portion of the single line positioned between:
   the region and the first end, and
   the region and the second end.

5. The BEOL line fuse structure of claim 1, further comprising a via that connects the single line to another line in a higher wiring level.

6. The BEOL line fuse structure of claim 1, further comprising a via that connects the single line to an external programming current source.

7. The BEOL line fuse structure of claim 1, further comprising a contact or via extending from the second end of the single line.

8. The BEOL line fuse structure of claim 7, wherein the contact connects the single line to a blow FET formed during front-end-of-line processing configured to blow the BEOL line fuse structure in the region between the first end of the single line and the second end of the single line.

\* \* \* \* \*